(12) United States Patent
Low et al.

(10) Patent No.: US 10,811,361 B2
(45) Date of Patent: Oct. 20, 2020

(54) SEAL RING BONDING STRUCTURES

(71) Applicant: VANGUARD INTERNATIONAL SEMICONDUCTOR SINGAPORE PTE. LTD., Singapore (SG)

(72) Inventors: Lieneng Low, Singapore (SG); Teck Wee Christopher Lim, Singapore (SG); Wai Mun Chong, Singapore (SG); Wan Tak Ng, Selangor (MY)

(73) Assignee: VANGUARD INTERNATIONAL SEMICONDUCTOR SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/006,385

(22) Filed: Jun. 12, 2018

(65) Prior Publication Data

US 2019/0378798 A1 Dec. 12, 2019

(51) Int. Cl.
*H01L 23/544* (2006.01)
*H01L 23/00* (2006.01)
*B81B 7/00* (2006.01)

(52) U.S. Cl.
CPC ......... *H01L 23/544* (2013.01); *B81B 7/0074* (2013.01); *H01L 24/29* (2013.01); *H01L 2223/54426* (2013.01); *H01L 2224/26145* (2013.01); *H01L 2224/29124* (2013.01); *H01L 2924/01032* (2013.01); *H01L 2924/01322* (2013.01)

(58) Field of Classification Search
CPC ......... H01L 2223/54426; H01L 23/544; H01L 2924/01322; H01L 24/29; H01L 2224/26145; B81B 7/0074
See application file for complete search history.

(56) References Cited

U.S. PATENT DOCUMENTS

2016/0376146 A1   12/2016   Diep et al.
2017/0297904 A1*  10/2017   Lin ..................... B81B 7/0038

OTHER PUBLICATIONS

Fischer et al., "Integrating MEMS and ICs", Microsystems & Nanoengineering IECAS, 2015, 16 pages.
Tilli et al., "Handbook of Silicon Based MEMS Materials and Technologies", Published by Elsevier Inc., 2010, First Edition, 636 pages.
Unknown, "Gasket design for optimal acoustic performance in MEMS microphones", www.st.com, Dec. 2016, DocID025705, 19 pages.
Martinez et al., "Apex Seal Design for the MEMS Rotary Engine Power System", ASME 2003 International Mechanical Engineering Congress and Exposition, Paper No. IMECE2003-42071, Nov. 15-21, 2003, Abstract.
Unknown, "Acoustic Interface Design Guide—Mouser Electronics", www.knowles.com, 2012, 40 pages.
(Continued)

*Primary Examiner* — Thanh Y. Tran
(74) *Attorney, Agent, or Firm* — Winston Hsu (57) ABSTRACT

The present disclosure relates to semiconductor structures and, more particularly, to seal ring structures with channels and methods of manufacture. The structure includes: a first wafer having a channel formed within a passivation layer; a second wafer having a protuberance which is insertable into the channel and which is bonded to the first wafer with eutectic bonding materials; and a plurality of stoppers or tabs extending within the channel and which provides a gap that has a dimension smaller than a gap formed in other portions of the channel.

20 Claims, 5 Drawing Sheets

(56) References Cited

OTHER PUBLICATIONS

Bleiker et al., "Cost-EfficientWafer-Level Capping for MEMS and Imaging Sensors by AdhesiveWafer Bonding", Micromachines, 2016, 12 pages.
Santagata et al., "Mechanical Design and Characterization for MEMS Thin-Film Packaging", Journal of Microelectromechanical Systems, vol. 21, No. 1, Feb. 2012, 10 pages.
Gillot et al., "Wafer level thin film encapsulation for MEMS", IEEE, Apr. 10, 2006, Abstract.
Unknown, "WLP of MEMS", www.spts.com, SPTS Technologies Ltd., 2015, 2 pages.

* cited by examiner

SEAL RING BONDING STRUCTURES

FIELD OF THE INVENTION

The present disclosure relates to semiconductor structures and, more particularly, to seal ring bonding structures and methods of manufacture.

BACKGROUND

In the fabrication of MEMS sensors, the MEMS sensor is often encapsulated within a seal ring structure. Depending on device performance requirements, the devices require either a hermetic sealing or non-hermetic sealing. Materials used for the sealing can include, e.g., Cu—Sn, Au—Sn, Au—Ge, Au—Si, Al—Ge, Al—Si, for eutectic encapsulation bonding.

To achieve sealing of the MEMS sensor, a certain degree of seal ring material "squish" is used to determine that the encapsulation bond did, in fact, take place. However, depending on the design of the seal ring, the eutectic bond material can excessively flow out of the seal ring region causing the device to short with sensitive structures, e.g., interconnects, etc. To prevent this from occurring, the seal ring design often needs to incorporate channels for the eutectic bond material to flow into.

The designs that cater to eutectic bond material squish usually can affect the alignment accuracy of the MEMS wafer to dummy cap, interconnect cap or CMOS wafer, as examples. It is noted that if there is not an accurate alignment of wafers, the electrical interconnects of bonded vias can be affected, for example. With this noted, usually the gap width of the channel design would define the product accuracy requirement for the encapsulation, as MEMS wafer to dummy cap, interconnect cap or CMOS wafer movement during eutectic bond can only be moved within the allowable gap width. For example, the product requirement may be <10 µm. However, the typical tool performance has an accuracy of upwards of 20 µm.

SUMMARY

In an aspect of the disclosure, a structure comprises: a first wafer having a channel formed within a passivation layer; a second wafer having a protuberance which is insertable into the channel and which is bonded to the first wafer with eutectic bonding materials; and a plurality of stoppers or tabs extending within the channel and which provides a gap that has a dimension smaller than a gap formed in other portions of the channel.

In an aspect of the disclosure, a structure comprises: a first wafer having a channel; a second wafer having a protuberance which is insertable into the channel; and a plurality of stoppers or tabs which narrow a gap in the channel and provide a mechanism to direct flow of eutectic encapsulation bonding material to a wider channel portion of the channel during a bonding process of the first wafer to the second wafer.

In an aspect of the disclosure, a method comprises: aligning a first wafer with a protuberance with a channel of a second wafer; and bonding the first wafer to the second wafer using eutectic bonding materials by subjecting the first wafer and the second wafer to a predetermined temperature and pressure such that eutectic bonding materials are prevented from overflowing from the channel by a narrow gap portion of the channel and are directed to flow into a wider gap portion of the channel.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to seal ring bonding structures and methods of manufacture. In more specific embodiments, the present disclosure is directed to eutectic encapsulation bonding structures provided between wafers. Advantageously, the encapsulation bonding structures described herein will provide a sufficient gap width for the eutectic bond material to flow, thereby reducing overflow and electrical shorts that may occur from eutectic bond material squishing out of the seal ring near sensitive structures, e.g., wiring interconnects, etc. Also, the encapsulation bonding structures described herein will provide yield improvement and assist the designer to meet product accuracy requirements, despite the accuracy of a typical tool performance.

In embodiments, the seal ring bonding structures described herein include stoppers or tabs which narrow a gap in the channel region of the structure. The narrowed portion provides a mechanism to direct the flow of any eutectic encapsulation bonding material to a wider channel portion. This mechanism effectively prevents or substantially eliminates overflow of the eutectic encapsulation bonding material from the channel, reducing the shorting between the eutectic encapsulation bonding material and other sensitive devices. The stoppers also provide an alignment mechanism, as the gap between the stopper and the edge of the channel are significantly reduced, preferably below a gap which could be achieved by a typical tool performance. By including these stoppers/tabs, the design can allow a wider channel (which will help to prevent the overflow) with no degradation to the alignment of the two wafers being bond.

The seal ring structures of the present disclosure can be manufactured in a number of ways using a number of different tools. In general, though, the methodologies and tools are used to form structures with dimensions in the micrometer and nanometer scale. The methodologies, i.e., technologies, employed to manufacture the seal ring structures of the present disclosure have been adopted from integrated circuit (IC) technology. For example, the structures are built on wafers and are realized in films of material patterned by photolithographic processes on the top of a wafer. In particular, the fabrication of the seal ring structures uses three basic building blocks: (i) deposition of thin films of material on a substrate, (ii) applying a patterned mask on top of the films by photolithographic imaging, and (iii) etching the films selectively to the mask.

Figure 1A:
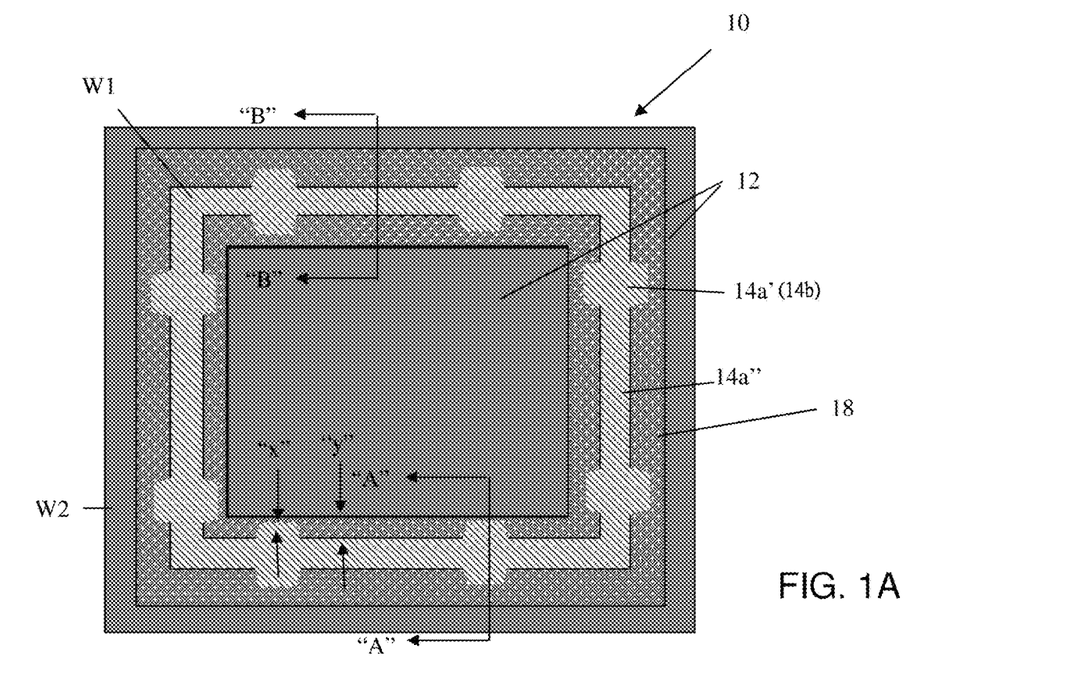
FIG. 1A shows a top view of a bonding structure and respective fabrication processes in accordance with aspects of the present disclosure.
Figure 1B:
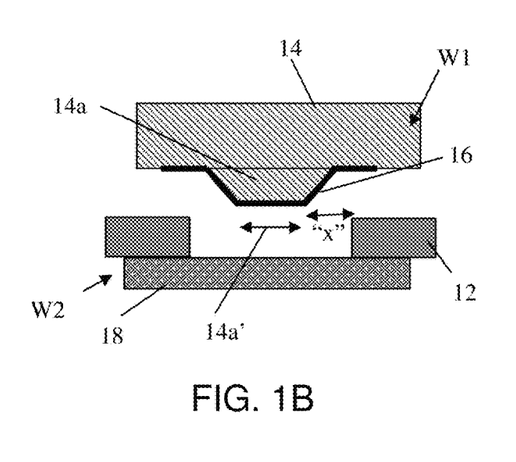
FIG. 1B shows a cross-sectional view along line A-A of FIG. 1A.
Figure 1C:
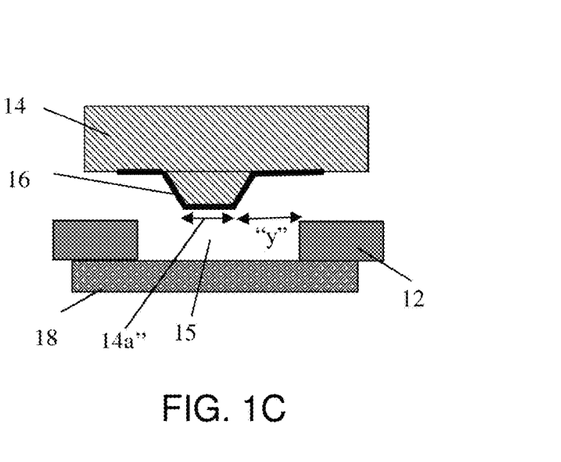
FIG. 1C shows a cross-sectional view along line B-B of FIG. 1A.

FIG. 1A shows a top view of a bonding structure and respective fabrication processes in accordance with aspects of the present disclosure. FIG. 1B shows a cross-sectional view along line A-A of FIG. 1A; whereas, FIG. 1C shows a cross-sectional view along line B-B of FIG. 1A. Referring to FIGS. 1A-1C, the structure 10 includes a first wafer "W1" bonded to a second wafer "W2" using, e.g., a Ge—Al eutectic bond. In embodiments, the first wafer "W1" can be composed of any semiconductor material 14, e.g., Si, having a downward extending protuberance 14a coated with an eutectic bonding material 16. For example, the eutectic bonding material 16 can be, e.g., Ge; although other bonding materials are contemplated herein.

As further shown in FIGS. 1A-1C, the protuberance 14a forms a ring structure which coincides with a shape of a channel 15 formed in the second wafer W2. The ring structure can be any closed ring shape, e.g., square, rectangle, circular, etc. The protuberance 14a includes a first width 14a' and a second width 14a". In embodiments, the first width 14a' is wider than the second width 14a" and, hence, is representative of a tab or stopper. The first width 14a' and the width 14a" can be formed by conventional CMOS patterning processes, e.g., lithography and etching, such that no further explanation is required herein for an understanding of the present disclosure.

In embodiments, as shown in FIG. 1A, the first width (e.g., stoppers or tabs 14b) 14a' are be provided on each of side of the ring structure and, hence, channel 15. It should be understood by those of ordinary skill in the art, though, that other combinations of stoppers or tabs 14b are contemplated herein. For example, one or more stoppers 14a' can be provided on any side of the ring structure or channel 15 in a symmetrical or asymmetrical pattern. In any of the embodiments described herein, the plurality of stoppers or tabs can be greater than or equal to one stopper or tab.

The second wafer "W2" includes the channel 15 which is formed in a passivation layer 12. The channel 15 can be formed by any conventional CMOS patterning processes to expose an underlying metal material 18, e.g., Al, which will form part of the eutectic bond with the eutectic bonding material 16. In forming the channel 15, for example, a resist formed over the passivation layer 12 (e.g., insulator material) is exposed to energy (light) to form a pattern (opening). An etching process with a selective chemistry, e.g., reactive ion etching (RIE), will be used to form one or more trenches (channels) in the passivation layer 12 through the openings of the resist. This etching process will expose the underlying metal material 18, e.g., Al. The resist can then be removed by a conventional oxygen ashing process or other known stripants.

In the bonded state, the first width 14a' (e.g., stoppers or tabs) and the second width 14a" (e.g., narrow portion of the protuberance 14a) are positioned or located within the channel 15 formed within the passivation layer 12 of the second wafer "W2". In the bonded state, the tab or stopper 14a' extends outwardly within the channel 15, forming a gap or space "x" defined by the edge of the first width 14a' and (e.g., stoppers or tabs) and an edge of the passivation layer 12; whereas the narrow section 14a" forms a larger gap or space "y" defined in the remaining areas of the channel 12 between the edge of the second width 14a" (e.g., narrower section) and the edge of the passivation layer 12.

In embodiments, due to the dimensions of the widths 14a', 14a", the gap "x" will be less than gap "y". For example, the gap "x" can be about 10 microns or less and, preferably about 5 microns. In further embodiments, the dimension of the gap "x" can be any dimension that is less than gap "y", i.e., the percentage of gap width length from the stopper to a standard gap width length can be varied from 1%-99%. By having gap with dimension "x", the bonding accuracy between MEMS to dummy cap or CMOS wafers can be improved, compared to using conventional structures. For example, the narrower gap "x" associated with the plurality of stoppers or tabs 14a' will provide an alignment structure for aligning the first wafer W1 to the second wafer W2. In addition, the combination of the gaps "x" and "y" will direct the flow of the metal material 18, e.g., Al, into the larger gap or space "y", preventing any of the material 18 from overflowing, e.g., squishing, outside of the channel and shorting with other metal structures, e.g., interconnect structure.

By way of example, to bond the wafers "W1" and "W2", the protuberance 14a is aligned with an inserted into the channel 15. The smaller gap "x" will be used to increase the alignment accuracy between the wafers W1, W2, e.g., MEMS to dummy cap or CMOS wafers. The wafers "W1" and "W2" are then subjected to temperature and pressure. For example, 400° C. @ 20 kN. As pressure is applied to one or both of the wafers "W1" and "W2", the metal material 18, e.g., Al, will begin to flow and bond with the eutectic bonding material 16. In this bonding process, any excess metal material 18 that is squeezed into the channel 15, will flow within the channel 15 and, more specifically, within the larger gap "y" between the width 14a" and the passivation layer 12, by the stoppers or tabs 14a'. The stoppers or tabs 14a' will effectively direct such flow of material towards the larger gap "y".

Figure 2A:
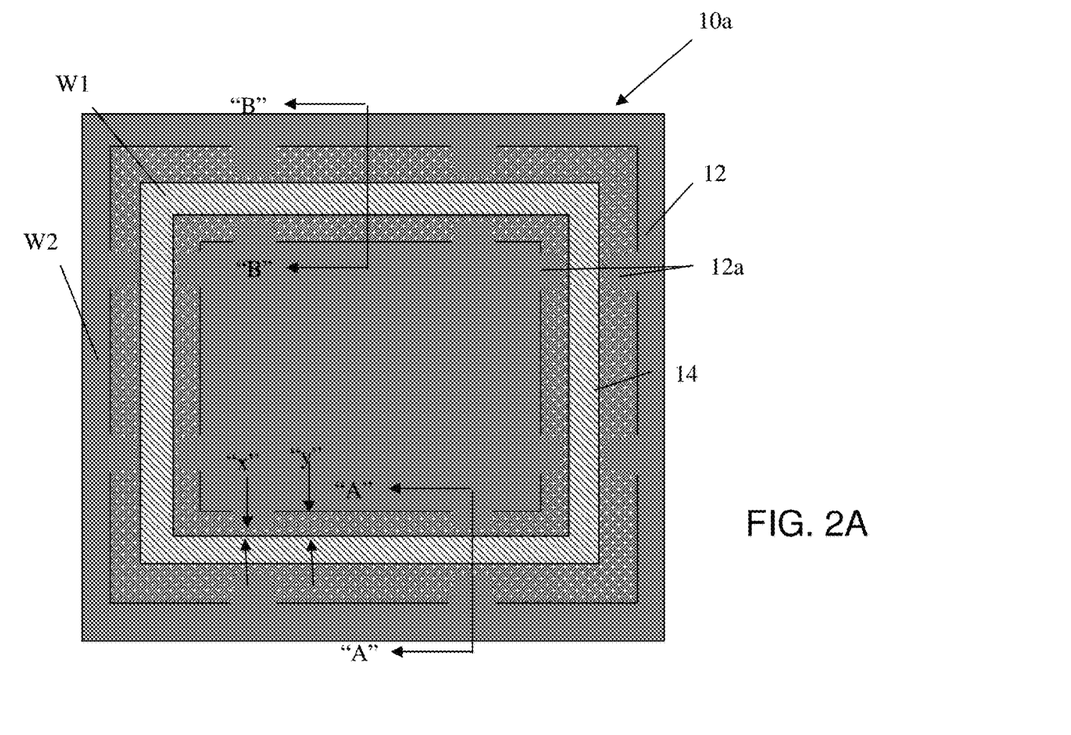
FIG. 2A shows a top view of a bonding structure and respective fabrication processes in accordance with additional aspects of the present disclosure.
Figure 2B:
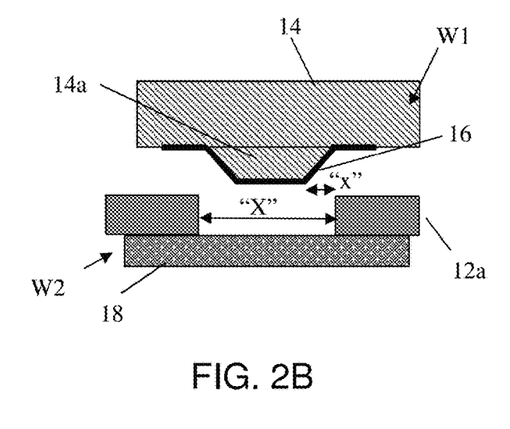
FIG. 2B shows a cross-sectional view along line A-A of FIG. 2A.
Figure 2C:
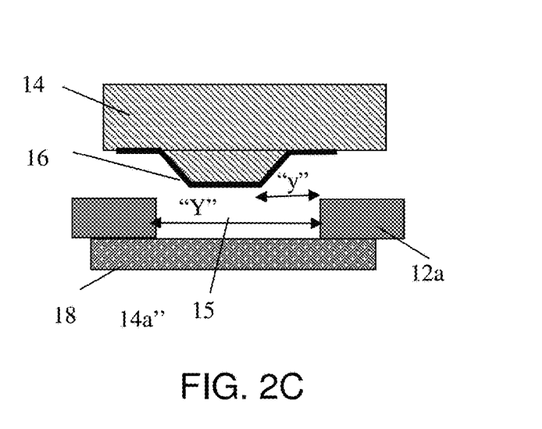
FIG. 2C shows a cross-sectional view along line B-B of FIG. 2A.

FIG. 2A shows a top view of a bonding structure and respective fabrication processes in accordance with additional aspects of the present disclosure. FIG. 2B shows a cross-sectional view along line A-A of FIG. 2A; whereas, FIG. 2C shows a cross-sectional view along line B-B of FIG. 2A. Referring to FIGS. 2A-2C, in the structure 10a the channel 15 now includes the stoppers or tabs 12a, which extend to within the channel 15, itself. Also, the protuberance 14a that fits into the channel 15 has a uniform width about its entire ring shape. This is in comparison to the protuberances shown in FIGS. 1A-1C which have different widths 14a', 14a".

Still referring to FIGS. 2A-2C, the structure 10a includes a first wafer "W1" bonded to a second wafer "W2" using, e.g., a Ge—Al eutectic bond. In embodiments, the first wafer "W1" can be composed of any semiconductor material 14, e.g., Si, having a downward extending protuberance 14a coated with eutectic bonding material 16. The passivation layer 12 includes the stoppers or tabs 12a which extend inwardly within the channel 15. Although two stoppers or tabs 12a are shown on each of side of the channel 15, other combinations of stoppers or tabs 12a are also contemplated herein. For example, one or more stoppers or tabs 12a can be provided on any side of the channel 15 in a symmetrical or asymmetrical pattern with (or without) the combination of the stoppers or tabs 14a' shown in FIG. 1A.

In embodiments, the stoppers or tabs 12a will have a smaller or narrower spacing (cross-sectional dimension) "X", compared to the spacing (cross-sectional dimension) "Y" of the remaining portion of the channel 15. Also, in the bonded state, a gap of space "x" defined by the edge of the stoppers or tabs 12a and the protuberance 14a will have a smaller dimension than the gap or space "y" defined between the wider section "Y" of the channel 15 and the edge of the protuberance 14a. In embodiments, the gap "x" can be about 10 microns or less and, more preferably, about 5 microns. In additional embodiments, the dimension of the gap "x" can be any dimension that is less than gap "y", i.e., the percentage of gap width length from the stopper to a standard gap width length can be varied from 1%-99%. And, as already described herein, in the bonded state, the stoppers or tabs 12a will allow the eutectic bond material, e.g., material 18, to flow into the channel 15 and, more specifically, within the wider gap width "y". The stoppers or tabs 12a will also assist in the accurate alignment of the wafers W1, W2 due to the smaller dimension of the gap "x".

Figure 3:
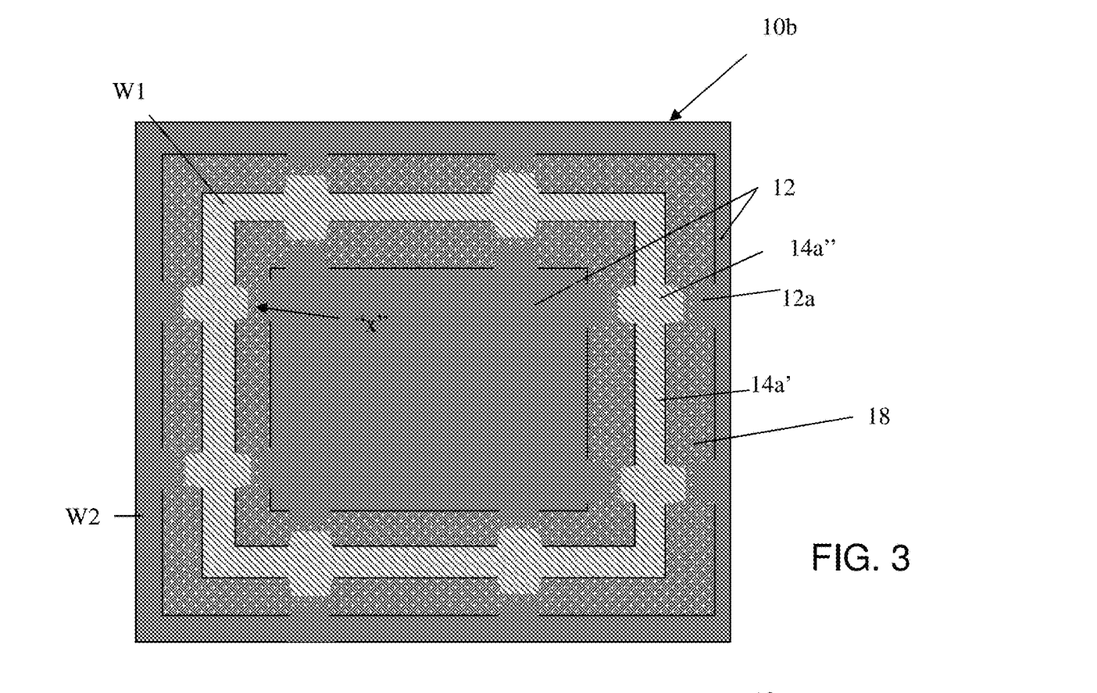
FIG. 3 shows a top view of a bonding structure and respective fabrication processes in accordance with yet another aspect of the present disclosure.

FIG. 3 shows a top view of a bonding structure and respective fabrication processes in accordance with additional aspects of the present disclosure. More specifically, FIG. 3 shows a structure 10b with stoppers or tabs 12a and stoppers or tabs 14a", i.e., the protuberance with the first width 14a' and the second width 14a". In this embodiments, the width 14a" is larger than width 14a', resulting in a smaller space in the channel between width 14a" and the tabs 12a (compared to the gap between width 14a' and tabs 12a). Accordingly, in this embodiment, the stoppers or tabs 12a are aligned with the stoppers or tabs 14a" resulting in a gap "x" which is smaller than remaining portions of the channel that does not have the stoppers or tabs. Although two stoppers or tabs 12a, 14a' are shown on each side of the channel 15, it is further contemplated that one or more of these stoppers or tabs 12a, 14a' can be aligned on the structure 10b. The remaining features of FIG. 3 and respective fabrication processes are similar to that shown in FIGS. 1A-2C.

Figure 4:
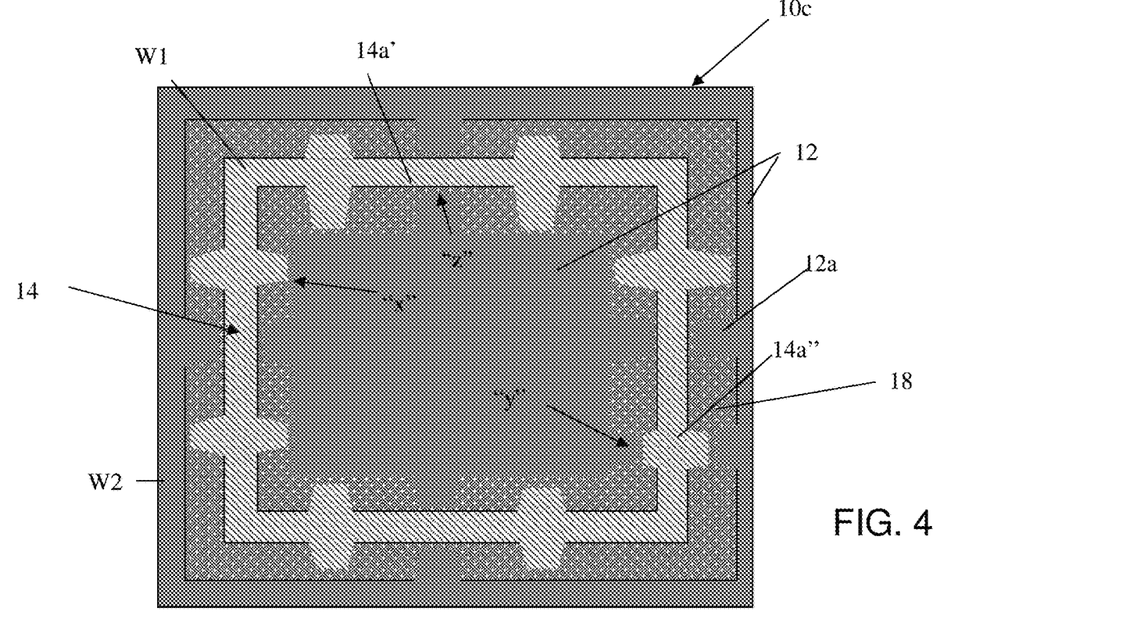
FIG. 4 shows a top view of a bonding structure and respective fabrication processes in accordance with yet another aspect of the present disclosure.

FIG. 4 shows a top view of a bonding structure and respective fabrication processes in accordance with yet another aspect of the present disclosure. More specifically, in the structure 10c shown in FIG. 4 the stoppers or tabs 12a can be offset at the larger width 14a" of the protuberance 14. In this embodiment, a single tab or stopper 12a is provided on three sides of the channel, with two tabs or stoppers 12a provided on one side of the channel. The placement and location of the stoppers or tabs 12a, 14a' results in a gap "x", "y", "z". It should be understood by those of skill in the art, though, that other configurations of tabs or stoppers can be provided on each side of the structure.

Figure 5:
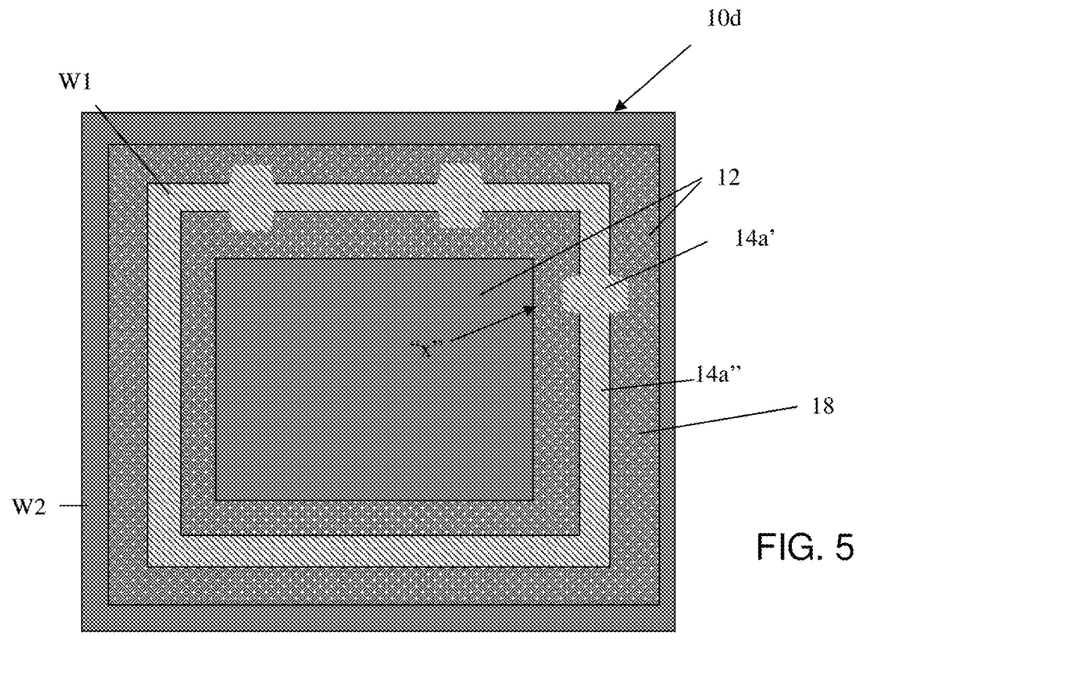
FIG. 5 shows a top view of a bonding structure and respective fabrication processes in accordance with yet another aspect of the present disclosure.

FIG. 5 shows a top view of a bonding structure and respective fabrication processes in accordance with yet another aspect of the present disclosure. More specifically, in the structure 10d shown in FIG. 5 the stoppers or tabs 14a' are provided in an asymmetrical pattern. In this pattern, the stoppers or tabs 14a' can be provided in a critical region (away from any sensitive structure) to prevent overflow of the material 18 in such critical regions. In this pattern, at least one of the stoppers or tabs 14a' is provided in an x-axis and a y-axis. The placement and location of the stoppers or tabs 14a' results in a gap "x" which is smaller than remaining portions of the channel that do not have the stoppers or tabs 12a, 14a', and which provides the advantages as already described herein.

Figure 6A:
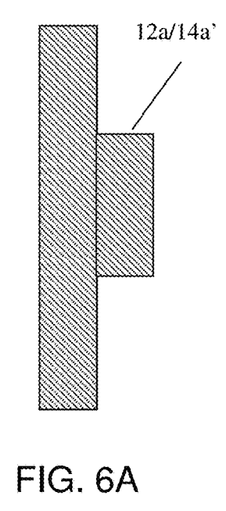
FIGS. 6A-6D show exemplary shapes of stoppers or tabs in accordance with aspects of the present disclosure.
Figure 6B:
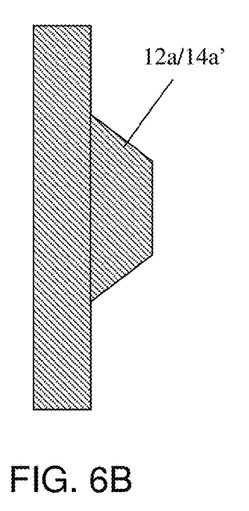
Figure 6C:
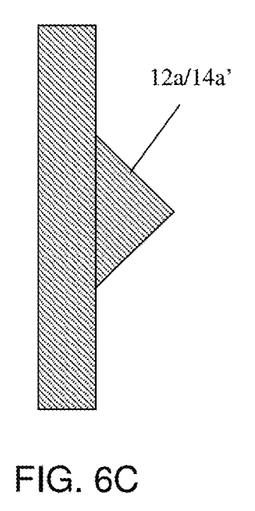
Figure 6D:
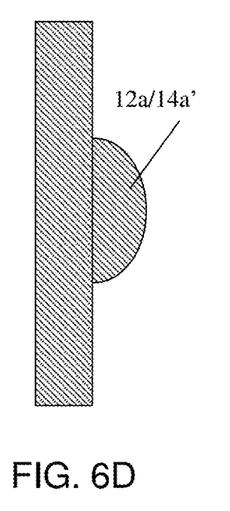

FIGS. 6A-6D show exemplary shapes of stoppers or tabs in accordance with aspects of the present disclosure. For example, FIG. 6A shows the stoppers or tabs 12a/14a' in a square or rectangular shape. FIG. 6B shows the stoppers or tabs 12a/14a' in a quadrilateral shape. FIG. 6C shows the stoppers or tabs 12a/14a' in a triangular shape. FIG. 6D shows the stoppers or tabs 12a/14a' in a semicircular shape. The present disclosure contemplates using any combination of the shapes shown in FIGS. 6A-6D.

Figure 7:
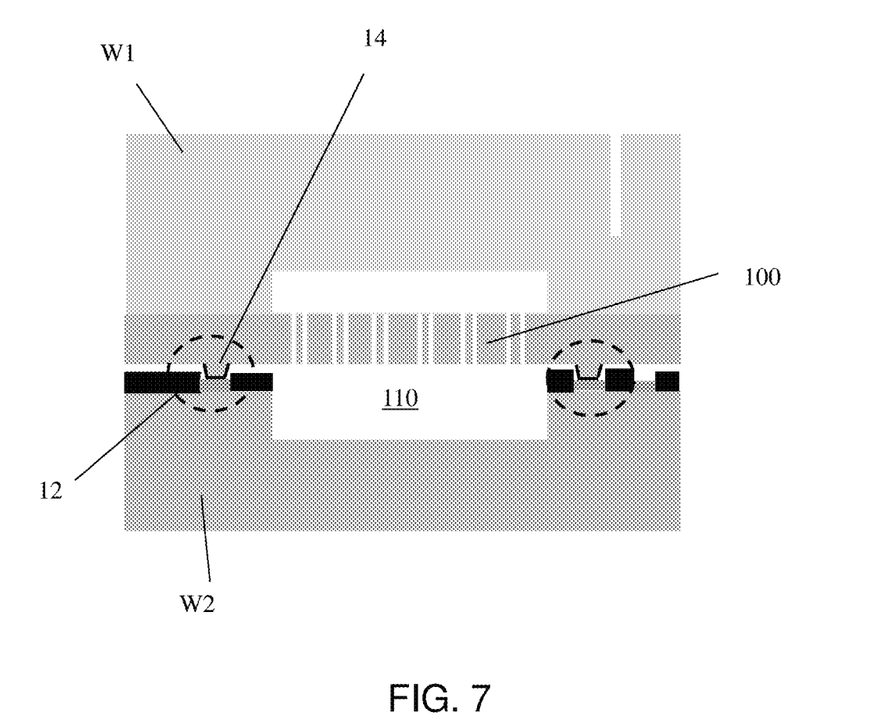
FIG. 7 shows two wafers bonded together in accordance with aspects of the present disclosure.

FIG. 7 shows two wafers bonded together in accordance with aspects of the present disclosure. More specifically, in the representation shown in FIG. 7, the first wafer "W1" can be a MEMS wafer (with MEMS beam 100), or wafer with other type of switch or active device that requires encapsulation. The second wafer "W2" can be, e.g., a dummy cap, interconnect cap or CMOS wafer. The FIG. 7 also representatively shows the eutectic bonding of the wafers using the channel and protuberance features shown and described herein. The bonding of the two wafers W1, W2, can result in either a hermetically or non-hermetically sealed cavity, generally shown at reference numeral 110.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
a first wafer having a channel formed within a passivation layer;
a second wafer having a protuberance which is insertable into the channel and which is bonded to the first wafer with eutectic bonding materials; and
wherein the protuberance has a first width comprising a plurality of stoppers or tabs and a second width narrower than the first width, the protuberance extends within the channel such that the first width comprising the plurality of stoppers or tabs provides a first gap within the channel that has a dimension narrower than a second gap formed in other portions of the channel with the second width of the protuberance.

2. The structure of claim 1, wherein the plurality of stoppers or tabs are structured to prevent overflow of the eutectic bonding materials from exiting the channel during a bonding process of the first wafer to the second wafer.

3. The structure of claim 1, wherein the plurality of stoppers or tabs are positioned about locations of the protuberance along its length, the plurality of stoppers or tabs have a larger width than other portions of the protuberance at different locations along its lengths.

4. The structure of claim 3, wherein the plurality of stoppers or tabs are symmetrically positioned about the protuberance about is perimeter at different locations than the second width.

5. The structure of claim 3, wherein the plurality of stoppers or tabs are asymmetrically positioned about the protuberance.

6. The structure of claim 1, wherein the plurality of stoppers or tabs are positioned about locations of the protuberance and the passivation layer, the plurality of stoppers or tabs of the protuberance have a larger width than narrower portions of the protuberance comprising the second width, and the plurality of stoppers or tabs of the passivation layer provide a smaller width of the channel than other portions of the channel.

7. The structure of claim 6, wherein the plurality of stoppers or tabs of the passivation layer are in alignment with the plurality of stoppers or tabs of the protuberance.

8. The structure of claim 6, wherein the plurality of stoppers or tabs of the passivation layer are offset from the plurality of stoppers or tabs of the protuberance.

9. The structure of claim 1, wherein a shape of the plurality of stoppers or tabs are any combination of a square, rectangle, quadrilateral, triangular and semicircular shape.

10. The structure of claim 1, wherein the plurality of stoppers or tabs are greater than or equal to one stopper or tab.

11. The structure of claim 1, wherein the first wafer is a MEMS wafer and the second wafer is one of a CMOS wafer, interconnect wafer and dummy cap wafer.

12. The structure of claim 1, wherein the first width and the second width extend along a length of the protuberance with the entirety of the protuberance extending within the channel such that the first gap is formed between a sidewall of the stoppers or tabs and a channel wall, on both sides of the channel, and the second gap is formed between a sidewall of the second width of the protuberance and the channel sidewall, on both sides of the channel.

13. A structure, comprising:
a first wafer having a channel formed within a passivation layer; and
a second wafer having a protuberance which is insertable into the channel and which is bonded to the first wafer with eutectic bonding materials,
wherein a portion of the channel comprises a plurality of stoppers or tabs which are inwardly extending portions of the passivation layer within the channel, and the portion of the channel has a narrower area than areas of other portions of the channel along its length such that when the protuberance extends into the channel, a first width of the channel having the stoppers or tabs provides a first gap within the channel that has a dimension narrower than a second gap formed in other portions of the channel without the stoppers or tabs.

14. A structure, comprising:
a first wafer having a channel;
a second wafer having a protuberance comprising a first width and a second width along is perimeter, the protuberance is insertable into the channel; and
wherein the first width comprises a plurality of stoppers or tabs which narrow a gap in the channel more than the second width within the channel, and the plurality of stoppers or tabs provide a mechanism to direct flow of eutectic encapsulation bonding material to a wider channel portion of the channel during a bonding process of the first wafer to the second wafer.

15. The structure of claim 14, wherein the plurality of stoppers or tabs narrow the channel at predetermined locations at its length different than at other portions where the second width is located.

16. The structure of claim 14, wherein the plurality of stoppers or tabs provide an alignment structure for aligning the first wafer to the second wafer during the bonding process.

17. The structure of claim 14, wherein the plurality of stoppers or tabs are positioned at critical regions along a length of the protuberance which prevent the eutectic bonding materials from overflowing from the channel and short with an adjacent interconnect.

18. The structure of claim 14, wherein the protuberance includes the plurality of stoppers or tabs at predetermined locations along a length of the protuberance, which have a larger width than the second width at other portions of the protuberance.

19. The structure of claim 14, wherein the channel includes the plurality of stoppers or tabs, which have a smaller width than wider portions of the channel.

20. The structure of claim 14, wherein the protuberance and the channel both include the plurality of stoppers or tabs.

* * * * *